(12) United States Patent
Kochi et al.

(10) Patent No.: US 10,821,923 B2
(45) Date of Patent: Nov. 3, 2020

(54) JOINT AND VEHICLE

(71) Applicant: HONDA MOTOR CO., LTD., Tokyo (JP)

(72) Inventors: Naoto Kochi, Saitama (JP); Ryohei Saiki, Saitama (JP); Takanori Suzuki, Saitama (JP)

(73) Assignee: HONDA MOTOR CO., LTD, Tokyo (JP)

( * ) Notice: Subject to any disclaimer, the term of this patent is extended or adjusted under 35 U.S.C. 154(b) by 0 days.

(21) Appl. No.: 16/577,772

(22) Filed: Sep. 20, 2019

(65) Prior Publication Data
US 2020/0108784 A1 Apr. 9, 2020

(30) Foreign Application Priority Data

Oct. 9, 2018 (JP) .................................. 2018-191039

(51) Int. Cl.
*B60R 16/03* (2006.01)
*B60R 16/02* (2006.01)
(Continued)

(52) U.S. Cl.
CPC .......... *B60R 16/03* (2013.01); *B60R 16/0215* (2013.01); *B60R 16/0238* (2013.01);
(Continued)

(58) Field of Classification Search
CPC . B60R 16/03; B60R 16/0215; B60R 16/0238; B60R 16/0239; B60R 16/02;
(Continued)

(56) References Cited

U.S. PATENT DOCUMENTS

| 2017/0232913 A1 | 8/2017 | Fukazu et al. |
| 2018/0145463 A1 | 5/2018 | Kiyuna et al. |
| 2019/0288461 A1 | 9/2019 | Kiyuna et al. |

FOREIGN PATENT DOCUMENTS

| JP | H10-189147 A | 7/1998 |
| JP | 2013-014275 A | 1/2013 |
(Continued)

OTHER PUBLICATIONS

Jun. 9, 2020, Japanese Office Action issued for related JP application No. 2018-191039.

*Primary Examiner* — Robert L Deberadinis
(74) *Attorney, Agent, or Firm* — Paratus Law Group, PLLC (57) ABSTRACT

A joint disposed on a power transmission path between an electric motor that drives a vehicle and a battery includes a first connector portion to which a first cable connected to a battery side is connected, a second connector portion to which a second cable connected to an electric motor side is connected, a joint box including the first connector portion and the second connector portion, a positive electrode bus bar provided inside the joint box and connects a positive electrode of the first connector portion and a positive electrode of the second connector portion, and a negative electrode bus bar provided inside the joint box and connects a negative electrode of the first connector portion and a negative electrode of the second connector portion. The positive electrode bus bar and the negative electrode bus bar are disposed to be spaced from each other in an upper-lower direction.

13 Claims, 9 Drawing Sheets

(51) Int. Cl.
  *B60R 16/023*   (2006.01)
  *H01M 2/20*    (2006.01)
  *H02G 3/08*    (2006.01)
  *H05K 7/02*    (2006.01)

(52) U.S. Cl.
  CPC ......... *B60R 16/0239* (2013.01); *H01M 2/202* (2013.01); *H02G 3/08* (2013.01); *H05K 7/02* (2013.01); *H01R 2201/26* (2013.01)

(58) Field of Classification Search
  CPC ....... B60R 16/023; H01M 2/202; H01M 2/20; H02G 3/08; H05K 7/02; H01B 2201/26
  See application file for complete search history.

(56) References Cited

FOREIGN PATENT DOCUMENTS

| | | |
|---|---|---|
| JP | 2017-143709 A | 8/2017 |
| JP | 2018-085250 A | 5/2018 |

JOINT AND VEHICLE

CROSS-REFERENCE TO RELATED APPLICATIONS

This application is based on and claims priority under 35 USC 119 from Japanese Patent Application No. 2018-191039 filed on Oct. 9, 2018.

TECHNICAL FIELD

The present invention relates to a joint disposed on a power transmission path between a battery and a vehicle including the joint.

BACKGROUND ART

In the joint of JP-A-10-189147, the waterproofness is enhanced by covering, with a cover, a bus bar fastening portion of a joint box to which connects cables of an electric vehicle.

However, in JP-A-10-189147, a solution when the joint box is submerged in water is not mentioned. When a joint box between a battery and an electric motor of an electric vehicle is submerged in water and a short circuit occurs due to internal flooding when a sealing structure of a case fails, the electric vehicle cannot travel.

Further, during a vehicle collision, it is necessary to protect the joint from an input of an external force.

SUMMARY

A first aspect of the present invention provides a joint and a vehicle in which the occurrence of a short circuit can be prevented when the joint box is submerged in water.

A second aspect of the present invention provides a vehicle in which the joint can be protected from an input of an external force and displacement during a vehicle collision.

A first embodiment of the present invention relates to a joint disposed on a power transmission path between an electric motor configured to drive a vehicle and a battery which includes:

a first connector portion to which a first cable connected to a battery side is connected;

a second connector portion to which a second cable connected to an electric motor side is connected;

a joint box in which the first connector portion and the second connector portion are provided;

a positive electrode bus bar which is provided inside the joint box and connects a positive electrode of the first connector portion and a positive electrode of the second connector portion; and a negative electrode bus bar which is provided inside the joint box and connects a negative electrode of the first connector portion and a negative electrode of the second connector portion, the positive electrode bus bar and the negative electrode bus bar are disposed to be spaced from each other in an upper-lower direction.

A second embodiment of the present invention relates to a vehicle which includes:

a battery and an electric motor which are disposed below a floor panel;

a first cable which extends to one side in a front-rear direction of the vehicle and is connected to a battery side;

a second cable which extends to the other side in the front-rear direction and is connected to an electric motor side; and a joint which includes a first connector portion to which the first cable is connected and a second connector portion to which the second cable is connected, the joint is disposed between the battery and the electric motor in the front-rear direction of the vehicle.

Advantageous Effects of Invention

According to the above first embodiment of the invention, since the positive and negative electrode bus bars are spaced from each other in the upper-lower direction, the two electrodes are less likely to be submerged in water at the same time when the joint box is submerged in water. Accordingly, when the joint box is submerged in water, occurrence of a short circuit can be prevented.

According to the above second embodiment of the invention, since the joint is disposed between the battery and the electric motor, the battery and the electric motor which are rigid bodies can protect the joint from an input of an external force during a vehicle collision.

DESCRIPTION OF EMBODIMENTS

A vehicle according to an embodiment of the present invention will be described below with reference to the drawings. The drawings should be seen based on a direction of reference numerals. In the following description, front, rear, left, right, upper, and lower directions are described according a view from an operator. In the drawings, a front side of the vehicle is denoted by Fr, a rear side is denoted by Rr, a left side is denoted by L, a right side is denoted by R, an upper side is denoted by U, and a lower side is denoted by D.

[Overall Structure of Vehicle]

Figure 1:
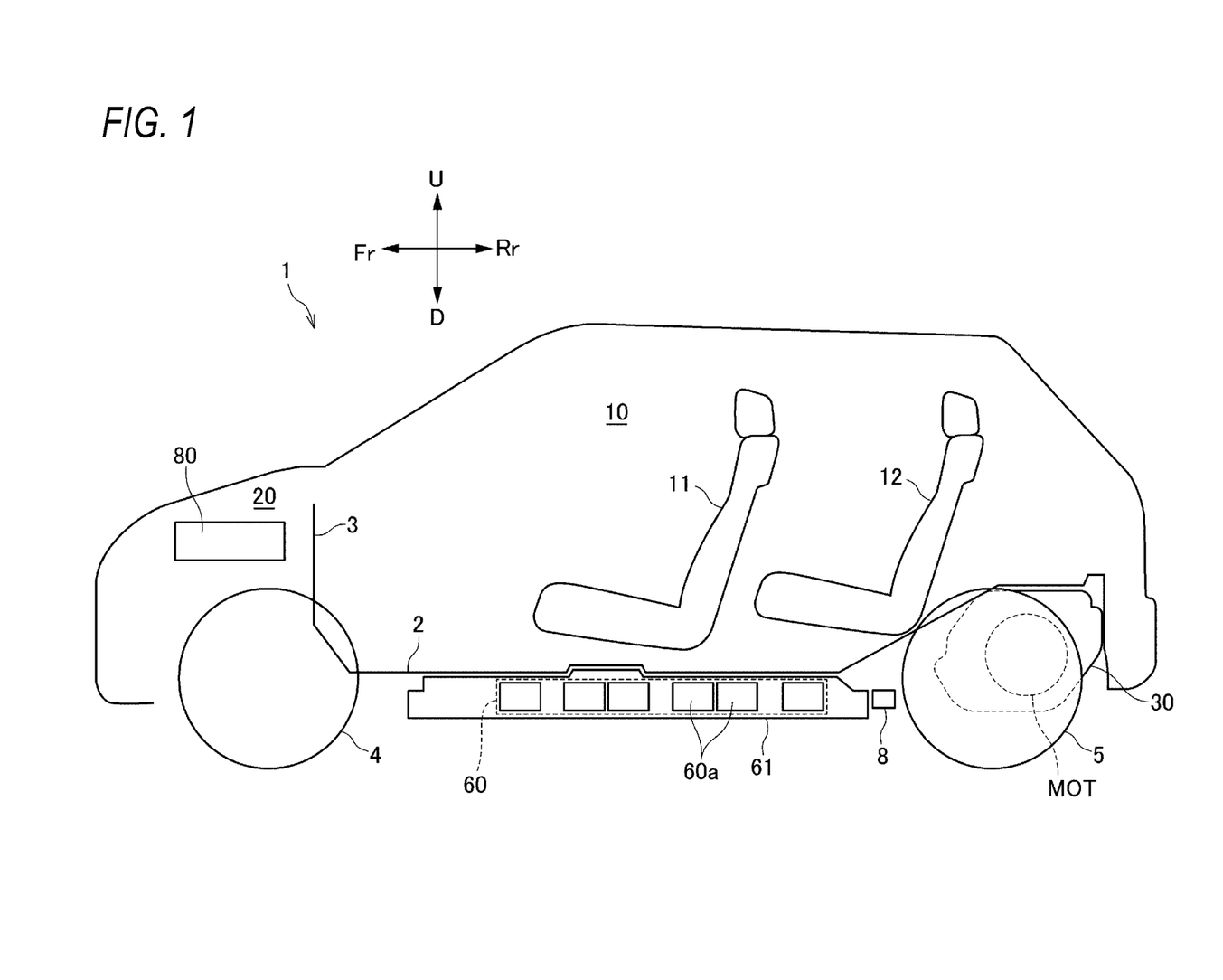
FIG. 1 is a schematic side view showing an overall structure of a vehicle according to an embodiment of the present invention.
Figure 2:
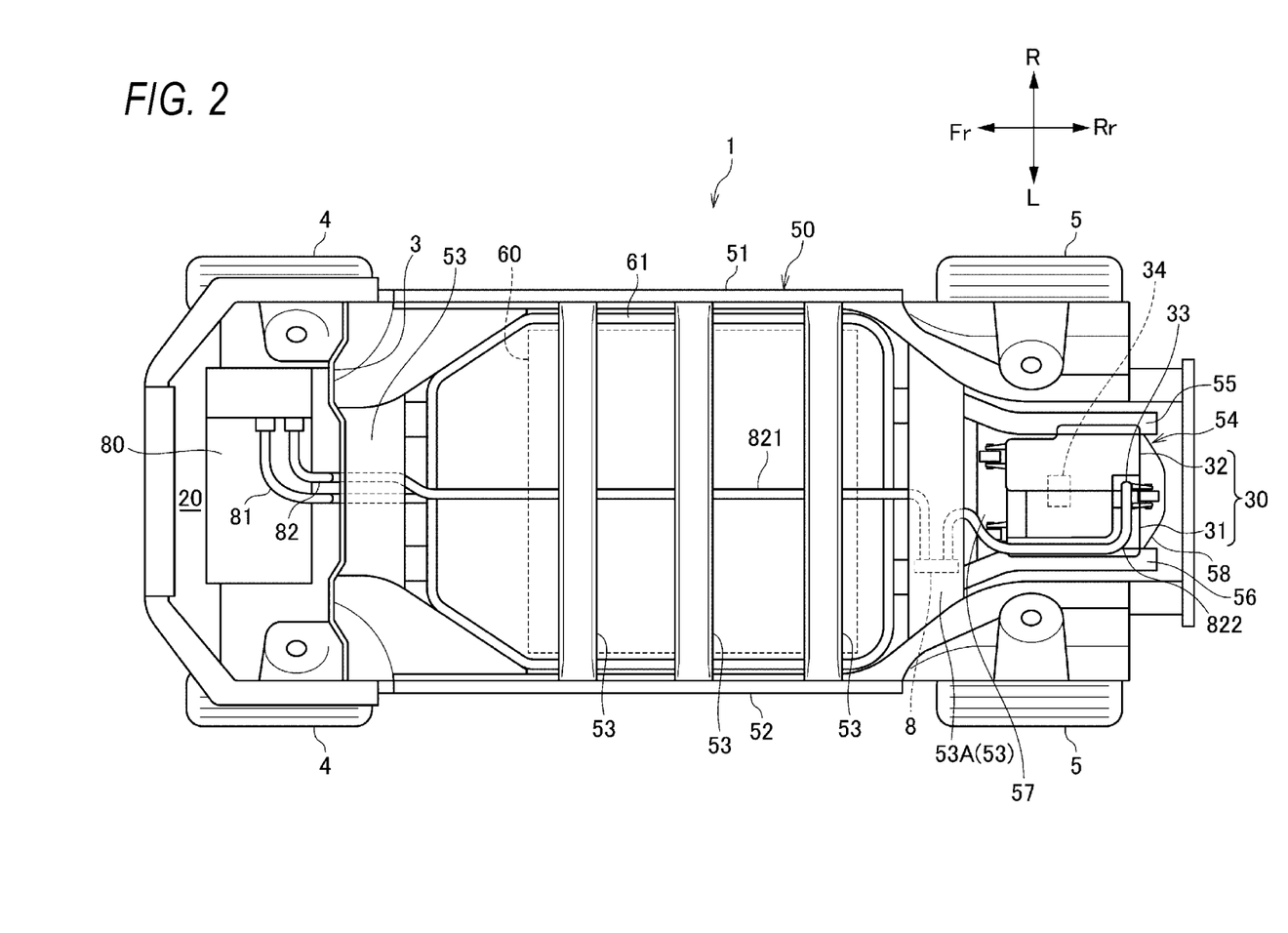
FIG. 2 is a plan view showing an underfloor structure of the vehicle in FIG. 1.

As shown in FIGS. 1 and 2, a vehicle 1 according to an embodiment of the present invention includes a vehicle interior 10 and a front room 20 in front of the vehicle interior 10, which are defined by a floor panel 2 and a dash panel 3. Front seats 11 and rear seats 12 are provided in the vehicle interior 10. A driving device unit 30 is provided below the floor panel 2 at a rear side of the rear seat 12. The driving device unit 30 drives left and right rear wheels 5. That is, in the vehicle 1, the left and right rear wheels 5 are driving wheels, and left and right front wheels 4 are driven wheels.

A battery 60 configured with a plurality of battery modules 60a is disposed below the vehicle interior 10. The battery 60 is accommodated in a battery case 61 and is disposed below the floor panel 2.

A vehicle body frame 50 includes a pair of left and right side members 51, 52 extending in a front-rear direction, a plurality of cross members 53 extending in a left-right direction and connecting the side members 51, 52, and a sub-frame 54 having a rectangular shape so as to surround the driving device unit 30. The sub-frame 54 includes a pair of sub-side members 55, 56 supported by the pair of side members 51, 52, and a front frame member 57 and a rear frame member 58 that connect the pair of sub-side members 55, 56.

The driving device unit 30 includes a driving device 31 that accommodates a motor MOT and a Power Control Unit (PCU) 32 that controls the motor MOT. The driving device 31 is provided with a transmission (not shown), and torque of the motor MOT is transmitted to an output shaft 311 (with reference to FIG. 4) via the transmission, and is transmitted from the output shaft 311 to the rear wheels 5.

Figure 3:
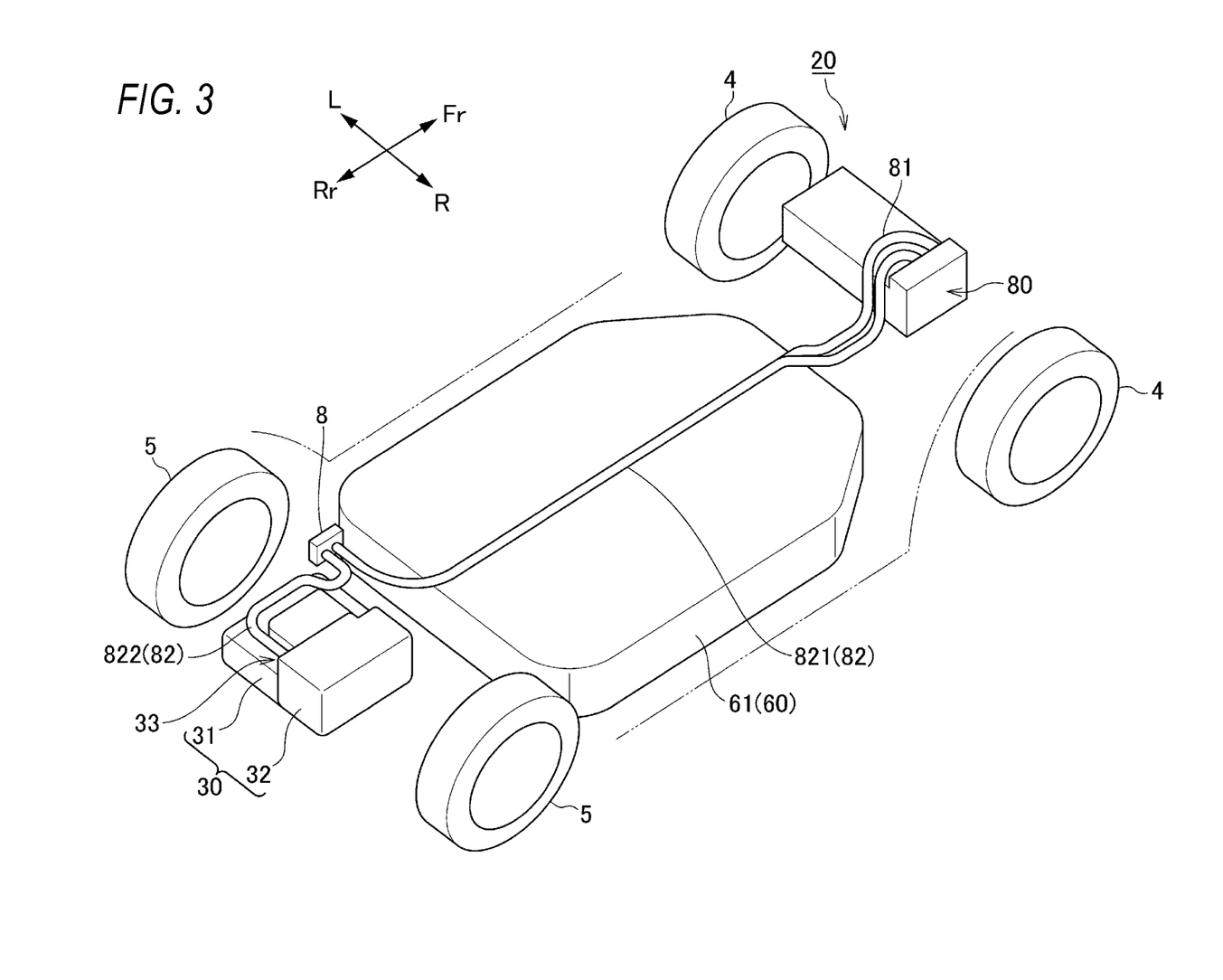
FIG. 3 is a perspective view showing the underfloor structure of the vehicle in FIG. 1.

As shown in FIGS. 2 and 3, the front room 20 is provided with a junction box 80 connected to a charging port (not shown) that is provided at an upper portion of a front end of the vehicle 1. The junction box 80 is connected to the battery 60 via a battery cable 81, and is connected to the PCU 32 via a PCU cable 82. The PCU cable 82 includes a first cable 821 extending from the junction box 80 and a second cable 822 extending from the PCU 32, and the first cable 821 and the second cable 822 are connected to each other via a joint 8. The second cable 822 is electrically connected to a cable connecting portion 33 of the PCU 32 of the driving device unit 30, and battery power (DC power) supplied from the second cable 822 to the PCU 32 is converted into three-phase AC power by an inverter (not shown) provided in the PCU 32, and then supplied to the motor MOT in the driving device 31 via an electrical connection portion 34 that electrically connects the PCU 32 and the driving device 31. That is, the battery cable 81 and the PCU cable 82 configure a power transmission path between the battery 60 and the motor MOT, and the joint 8 is disposed on the power transmission path.

The joint 8 is fixed to a lower surface of a support cross member 53A, which is a vehicle frame part located between the battery 60 and the driving device unit 30. The first cable 821 extends from the joint 8 to a front side of the vehicle 1, and the second cable 822 extends from the joint 8 to a rear side of the vehicle 1. The joint 8 according to each embodiment of the present invention will be described in detail below.

First Embodiment

Figure 5:
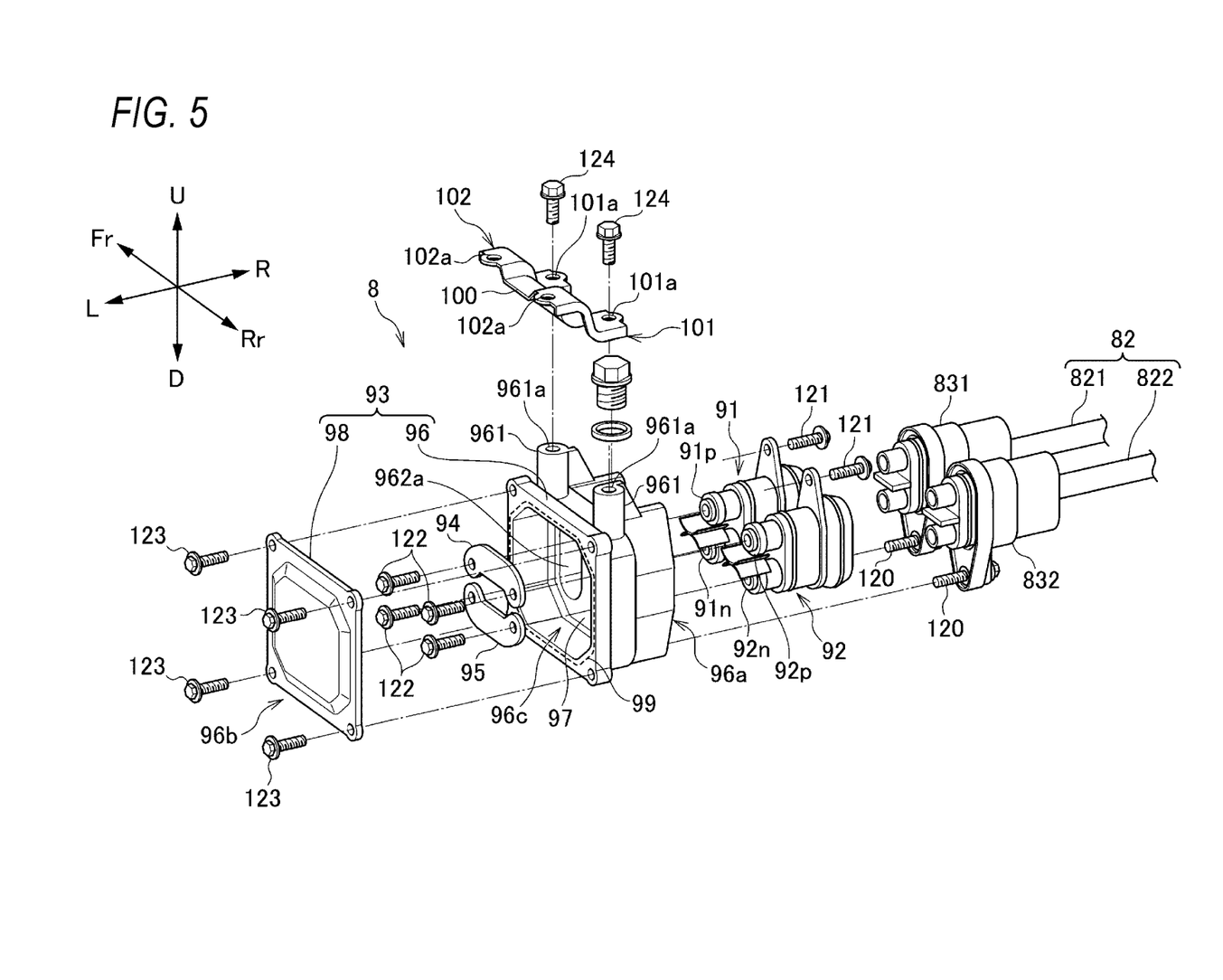
FIG. 5 is an exploded perspective view of a joint according to a first embodiment of the present invention.
Figure 6:
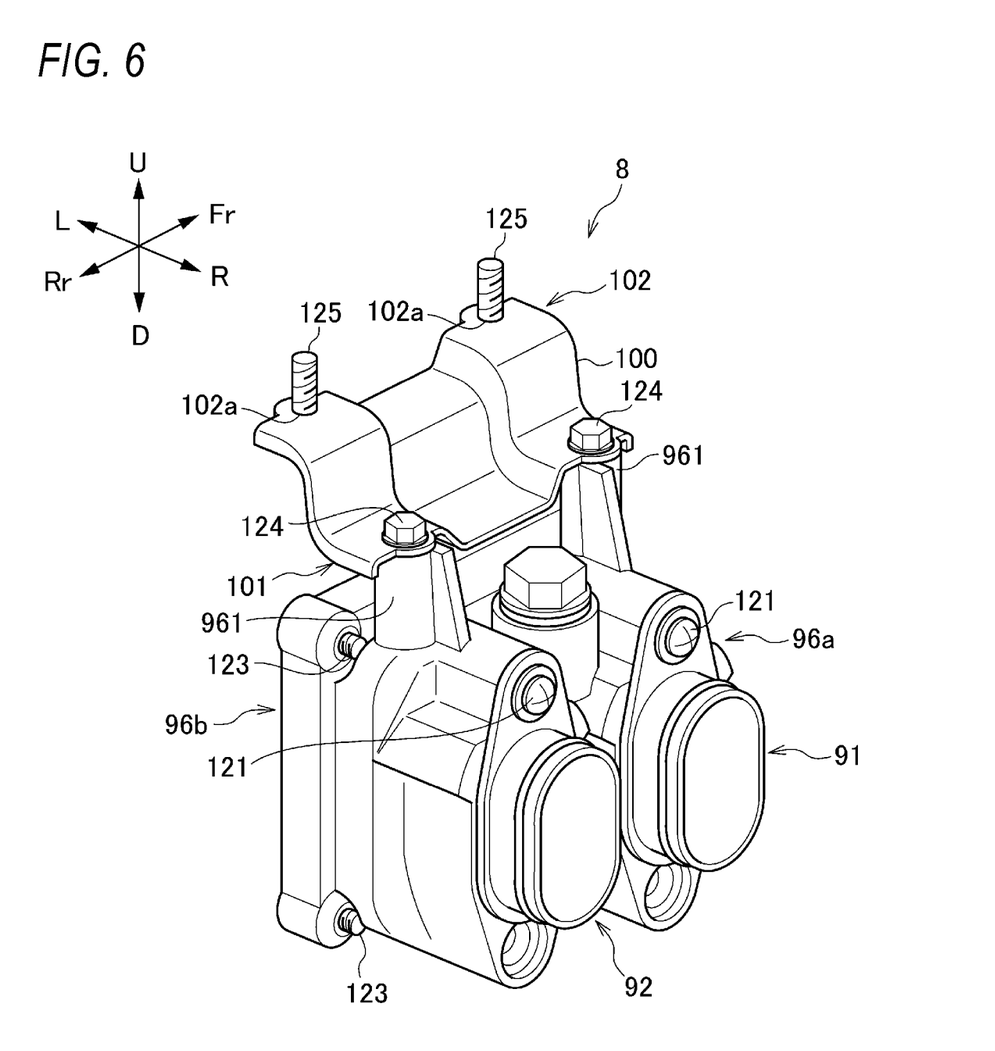
FIG. 6 is a perspective view of the joint in FIG. 5.
Figure 7:
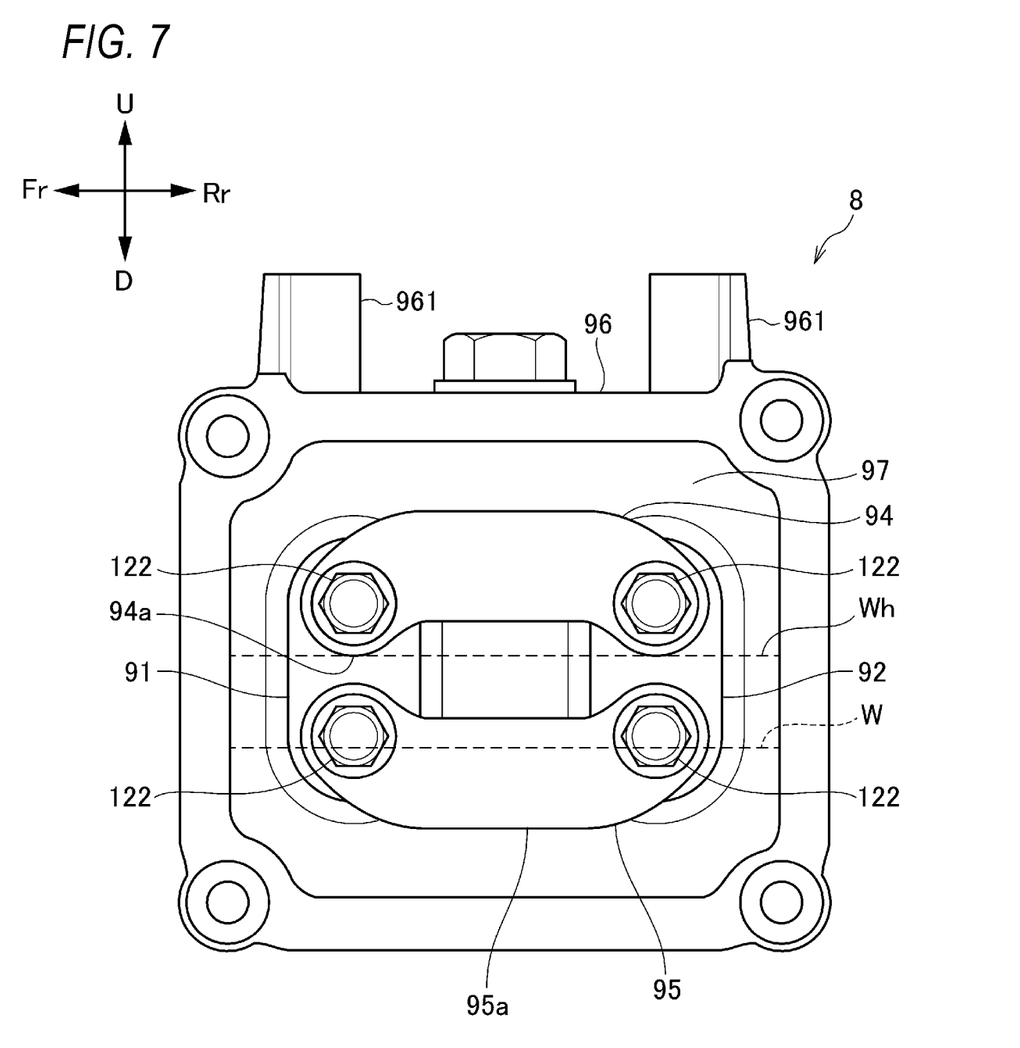
FIG. 7 is an illustrative view showing an interior of the joint in FIG. 5.

As shown in FIGS. 5 to 7, the joint 8 according to a first embodiment includes a first connector portion 91 to which the first cable 821 is connected, a second connector portion 92 to which the second cable 822 is connected, and a joint box 93 in which the first connector portion 91 and the second connector portion 92 are provided. A positive electrode bus bar 94 that connects a positive electrode 91p of the first connector portion 91 and a positive electrode 92p of the second connector portion 92, and a negative electrode bus bar 95 that connects a negative electrode 91n of the first connector portion 91 and a negative electrode 92n of the second connector portion 92 are provided inside the joint box 93.

The first connector portion 91 and the second connector portion 92 are disposed adjacently on a holding wall 97 that constitutes a right side surface 96a of a box body 96 of the joint box 93. Through holes 962a into which the first connector portion 91 and the second connector portion 92 are inserted are provided in the holding wall 97 adjacently in the front-rear direction. After being inserted into the through holes 962a, the first connector portion 91 and the second connector portion 92 are fixed to the box body 96 by bolts 121 from an outside of the joint box 93. A connector portion 831 of the first cable 821 and a connector portion 832 of the second cable 822 are respectively connected to the first connector portion 91 and the second connector portion 92, and are then fixed to the box body 96 by bolts 120. In this way, the first connector portion 91 and the second connector portion 92 are disposed adjacently on the right side surface 96a of the box body 96 of the joint box 93, and thus connection between the first cable 821 and the joint 8 and between the second cable 822 and the joint 8 can be performed easily.

As shown in FIGS. 5 and 7, inside the joint box 93, the positive electrode bus bar 94 and the negative electrode bus bar 95 are fixed to the first connector portion 91 and the second connector portion 92 by bolts 122, respectively. That is, the first and second cables 821, 822 and the positive and negative electrode bus bars 94, 95 are connected to the first connector portion 91 and the second connector portion 92 from opposite directions.

The positive electrode bus bar 94 and the negative electrode bus bar 95 are spaced from each other in an upper-lower direction. Thus, since the positive electrode bus bar 94 and the negative electrode bus bar 95 are spaced from each other in the upper-lower direction, the positive electrodes 91p, 92p and the negative electrodes 91n, 92n of the first and second connector portions 91, 92 are less likely to be submerged in water at the same time when the joint box 93 is submerged in water. That is, no short circuit occurs even in a case where water enters into the joint box 93 and a water level exceeds a height of a lower end 95a of the negative electrode bus bar 95, for example, as indicated by a chain line W in FIG. 7. In this example, occurrence of a short circuit can be prevented until the water level reaches a height of a lower end 94a of the positive electrode bus bar 94, as indicated by a chain line Wh.

The box body 96 includes an opening 96c on a left side surface 96b opposite to the right side surface 96a on which the first connector portion 91 and the second connector portion 92 are provided, and the opening 96c is covered with a joint cover 98. The joint cover 98 and the box body 96 which constitute the joint box 93 are sealed with a sealing member 99. The joint cover 98 is fixed to the box body 96 by a plurality of bolts 123. According to the configuration, the positive electrode bus bar 94 and the negative electrode bus bar 95 are attached to the box body 96, the positive electrode 91p of the first connector portion 91 and the positive electrode 92p of the second connector portion 92 are connected by the positive electrode bus bar 94, the negative electrode 91n of the first connector portion 91 and the negative electrode 92n of the second connector portion 92 are connected by the negative electrode bus bar 95, and then the joint cover 98 is assembled to the box body 96 via the sealing member 99, so that the joint 8 can be easily formed.

As shown in FIGS. 5 and 6, the box body 96 is provided with a pair of bosses 961 to which a bracket 100 is fixed. The bracket 100 is a part for attaching the joint 8 to the lower surface of the support cross member 53A. The bosses 961 are provided at an upper end portion of the box body 96 so as to be spaced from each other in the front-rear direction. A bolt hole 961a is formed in an upper end surface of the boss 961. The bracket 100 includes a first fastening portion 101 fastened to the bosses 961 and a second fastening portion 102 fastened to the lower surface of the support cross member 53A. The first fastening portion 101 and the second fastening portion 102 are formed stepwise such that the first fastening portion 101 is located at a position lower than the second fastening portion 102. The first fastening portion 101 is provided with a pair of bolt insertion holes 101a corresponding to the bolt holes 961a of the two bosses 961. The second fastening portion 102 is provided with a pair of bolt insertion holes 102a corresponding to a pair of bolt holes (not shown) opened in the lower surface of the support cross member 53A.

The bracket 100 is fixed to the box body 96 by inserting and fastening bolts 124 inserted into the respective bolt insertion holes 101a of the first fastening portion 101 into the bolt holes 961a of the bosses 961, and is fixed to the support cross member 53A by inserting and fastening bolts 125 inserted into the respective bolt insertion holes 102a of the second fastening portion 102 into bolt holes (not shown) of the support cross member 53A. Accordingly, the joint 8 is fixed to the support cross member 53A via the bracket 100. In this way, the joint 8 is fastened to the support cross member 53A which is a vehicle frame part, so that the joint 8 can be stably held.

The first cable 821 and the second cable 822 extending in opposite sides in the front-rear direction of the vehicle 1 are connected by the joint 8, so that two cables having better handling property than one long cable can be used as the PCU cable 82. Further, during a vehicle collision, an input load acting on the first cable 821 and the second cable 822 can be separated by the joint 8.

As shown in FIGS. 2 and 3, the joint 8 is disposed outward than the first cable 821 and the second cable 822 in a width direction of the vehicle 1. In this way, the first cable 821 and the second cable 822 are disposed close to a center of the vehicle 1 and the joint 8 is disposed on the outer side in the width direction of the vehicle 1, so that displacement due to a vehicle collision can be absorbed by using a curvature of the first cable 821 and the second cable 822 during the collision.

Figure 4:
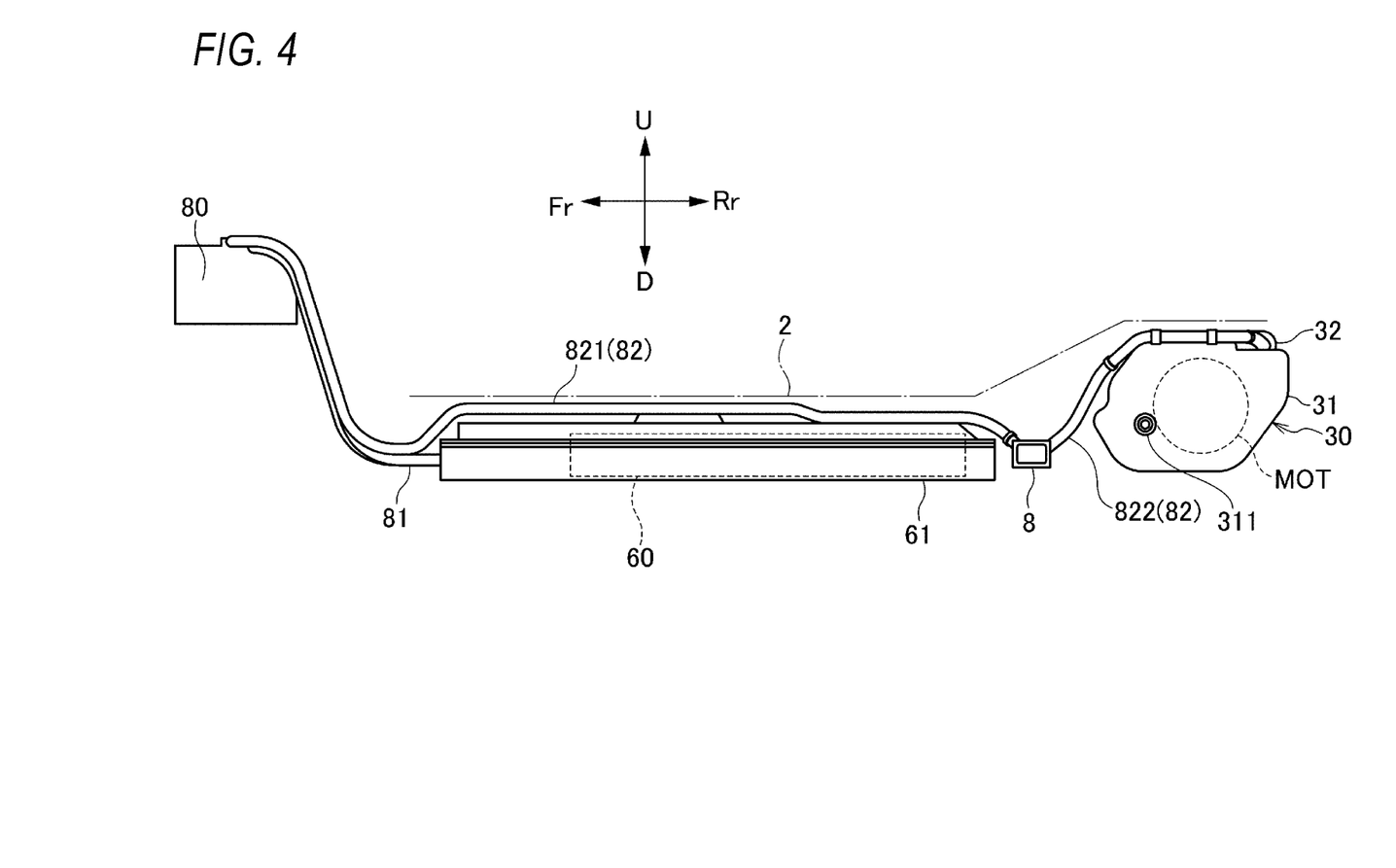
FIG. 4 is a side view showing the underfloor structure of the vehicle in FIG. 1.

As shown in FIG. 4, a lower end of the joint 8 is located at a position lower than the first cable 821 and the second cable 822. By this configuration, the first cable 821 and the second cable 822 are curved toward the joint 8 in the upper-lower direction, and the displacement due to a vehicle collision can be absorbed by using the curvature of the first cable 821 and the second cable 822 during the collision. Further, since the joint 8 is located below the first cable 821 and the second cable 822, the maintainability is good.

The first cable 821 is disposed between the battery 60 and the floor panel 2, and the second cable 822 is disposed between the driving device unit 30 and the floor panel 2. By this configuration, the first cable 821 and the second cable 822 extending in the front-rear direction of the vehicle 1 can be protected over a wide area.

As shown in FIG. 2, the joint 8 is disposed between the battery case 61 and the motor MOT in the front-rear direction of the vehicle 1, and is further disposed between the battery case 61 and the sub-frame 54. The joint 8 can be protected for being sandwiched by rigid bodies.

As shown in FIGS. 1 and 4, the joint 8 is disposed within a width of the battery case 61 in a height direction of the vehicle 1. The joint 8 is disposed within a width of the sub-frame 54 in the height direction of the vehicle 1. According to the configuration, the joint 8 can be protected more reliably from the load input due to interference during a collision of the vehicle 1 or the like.

Second Embodiment

Figure 8:
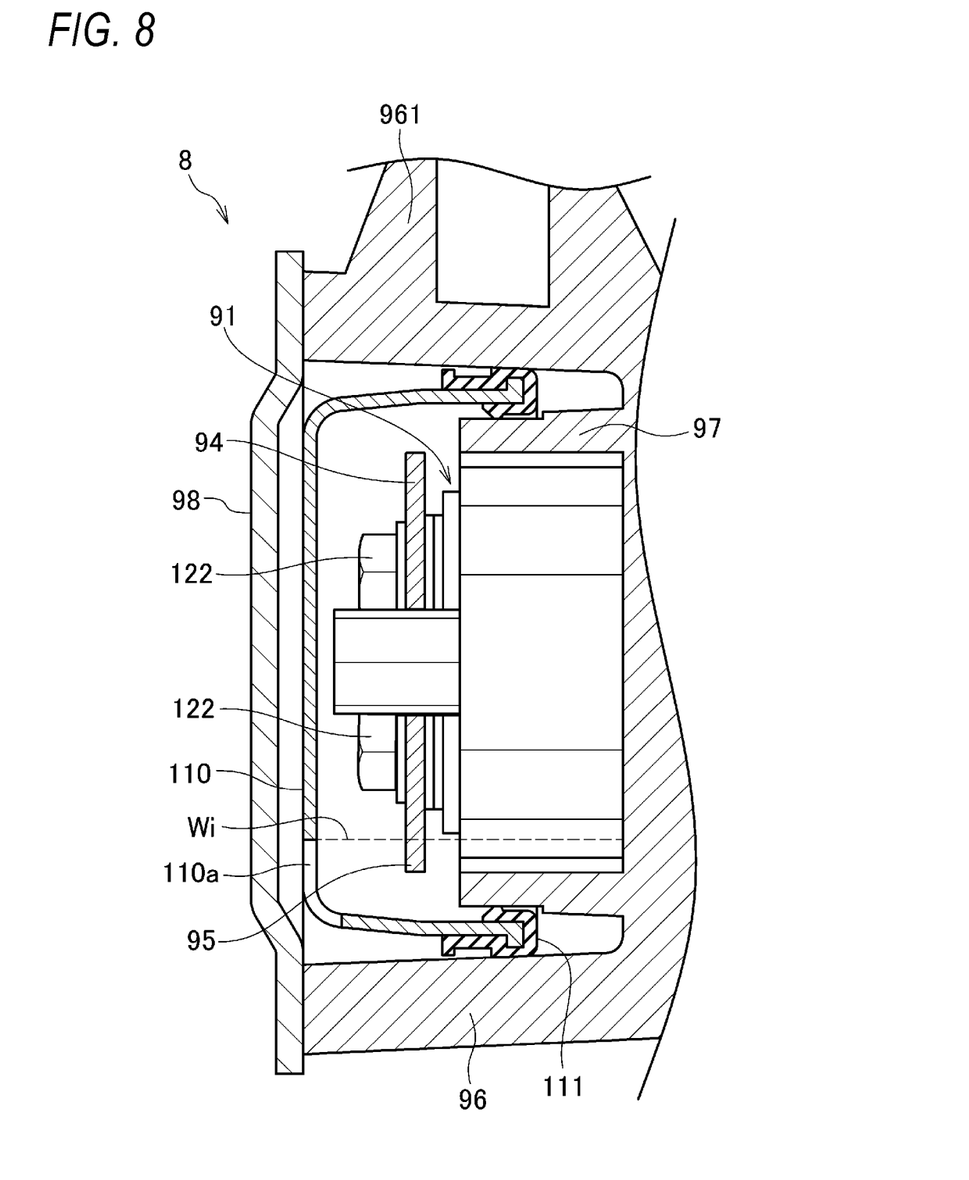
FIG. 8 is a cross-sectional view of a joint according to a second embodiment of the present invention.
Figure 9:
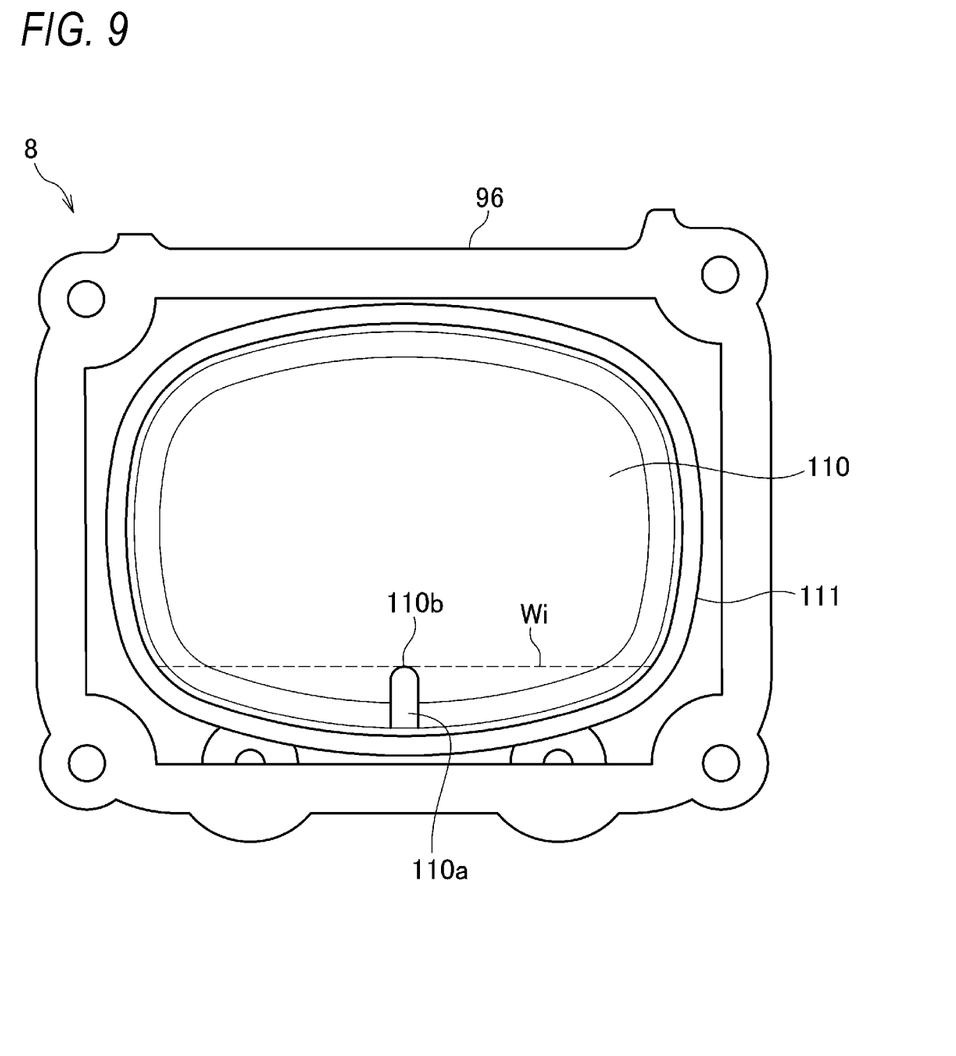
FIG. 9 is a front view showing an interior of the joint in FIG. 8.

As shown in FIGS. 8 and 9, the joint 8 according to a second embodiment further includes an inner cover 110 which is disposed between the box body 96 and the joint cover 98 and surrounds the positive electrode bus bar 94 and the negative electrode bus bar 95, and an inner sealing member 111 for sealing the inner cover 110 and the holding wall 97 for holding the first connector portion 91 and the second connector portion 92. According to the configuration, the occurrence of a short circuit can be more reliably prevented by the inner cover 110 and the inner sealing member 111.

As shown in FIG. 8, an opening 110a is provided at a lower portion of the inner cover 110. According to the configuration, ground fault detection is enabled by grounding the negative electrode bus bar 95 with water that enters through the opening 110a, and a short circuit can be prevented by avoiding submersion of the positive electrode bus bar 94.

An upper end 110b of the opening 110a is located at a position lower than an upper end of the negative electrode bus bar 95. According to the configuration, even if water enters an interior of the joint box 93, a water level in the inner cover 110 can be kept lower than the upper end of the negative electrode bus bar 95. That is, since the interior of the inner cover 110 is filled with air, the water level in the inner cover 110 is unlikely to rise above a height of the upper end of the opening 110a, as shown by the dotted line Wi in FIG. 8.

The above embodiments may be appropriately modified, improved, or the like.

For example, although the negative electrode bus bar 95 is disposed below the positive electrode bus bar 94 in the embodiments described above, an upper and lower arrangement of the positive electrode bus bar 94 and the negative electrode bus bar 95 may be reversed.

At least the following matters are described in the present specification. Corresponding components in the above-described embodiments are shown in parentheses, without being limited thereto.

(1) A joint (joint 8) disposed on a power transmission path between an electric motor (motor MOT) configured to drive a vehicle and a battery (battery 60) which includes:

a first connector portion (first connector portion 91) to which a first cable (first cable 821) connected to a battery side is connected;

a second connector portion (second connector portion 92) to which a second cable (second cable 822) connected to an electric motor side is connected;

a joint box (joint box 93) in which the first connector portion and the second connector portion are provided;

a positive electrode bus bar (positive electrode bus bar 94) which is provided inside the joint box and connects a positive electrode (positive electrode 91p) of the first connector portion and a positive electrode (positive electrode 92p) of the second connector portion; and a negative electrode bus bar (negative electrode bus bar 95) which is provided inside the joint box and connects a negative electrode (negative electrode 91n) of the first connector portion and a negative electrode (negative electrode 92n) of the second connector portion.

The positive electrode bus bar and the negative electrode bus bar are disposed to be spaced from each other in an upper-lower direction.

According to (1), since the positive electrode bus bar and the negative electrode bus bar are spaced from each other in the upper-lower direction, the two electrodes are less likely to be submerged in water at the same time when the joint box is submerged in water. Accordingly, when the joint box is submerged in water, occurrence of a short circuit can be prevented.

(2) In the joint according to (1), the first connector portion and the second connector portion are disposed adjacently on a surface (right side surface 96a) of the joint box, and the first and second cables and the positive and negative electrode bus bars are connected to the first connector portion and the second connector portion from opposite directions.

According to (2), since the first connector portion and the second connector portion are disposed adjacently on the surface of the joint box, connection between the first cable and the joint and between the second cable and the joint can be performed easily. The joint adopts a structure in which the first and second cables and the positive and negative electrode bus bars are connected to the first connector portion and the second connector portion from opposite directions, so that the structure of the joint can be simplified.

(3) In the joint according to (2), the joint box includes:

a box body (box body 96) which includes an opening (opening 96c) on a surface (left side surface 96b) opposite to the surface on which the first connector portion and the second connector portion are disposed;

a joint cover (joint cover 98) which covers the opening;

a sealing member (sealing member 99) which seals the box body and the joint cover;

an inner cover (inner cover 110) which is disposed between the box body and the joint cover and surrounds the positive electrode bus bar and the negative electrode bus bar; and an inner sealing member (inner sealing member 111) which seals the inner cover and a holding wall (holding wall 97) which holds the first connector portion and the second connector portion.

According to (3), the sealing member can further enhance the sealing property inside the joint box. The occurrence of a short circuit can be further prevented by the inner sealing member.

(4) In the joint according to (3), an opening (opening 110a) is provided at a lower portion of the inner cover.

According to (4), the opening is provided at the lower portion of the inner cover and a bus bar located on the lower side is grounded with water entering through the opening, so that a short circuit can be prevented while allowing ground fault detection.

(5) In the joint according to (4), an upper end (upper end 110b) of the opening is located at a position lower than an upper end of a bus bar which is one of the positive electrode bus bar and the negative electrode bus bar that is located on a lower side.

According to (5), since an interior of the inner cover is filled with air, water does not enter above the upper end of the opening. Therefore, the upper end of the opening is located below the upper end of the bus bar which is located on the lower side, so that the water level in the inner cover can be kept low, and an immediate short circuit during the submersion can be prevented.

(6) A vehicle (vehicle 1) includes:

a battery (battery 60) and an electric motor (motor MOT) which are disposed below a floor panel (floor panel 2);

a first cable (first cable 821) which is connected to a battery side;

a second cable (second cable 822) which is connected to an electric motor side; and the joint according to any of (1) to (5).

The joint is fixed to a vehicle frame part (support cross member 53A), the first cable extends from the joint to one side (front side) in a front-rear direction of the vehicle, and the second cable extends from the joint to the other side (rear side) in the front-rear direction.

According to (6), by fastening the joint to the vehicle frame part, the joint can be stably held. The first cable and the second cable extending in opposite sides in the front-rear direction of the vehicle are connected by the joint, so that two cables having better handling property than one long cable can be used. Further, during a vehicle collision, an input load acting on the first cable and the second cable can be divided by the joint.

(7) In the vehicle according to (6), the joint is disposed outward than the first cable and the second cable in a width direction of the vehicle.

According to (7), the first cable and the second cable are disposed close to a center of the vehicle and the joint is disposed on the outer side in the width direction of the vehicle, so that displacement due to a vehicle collision can be absorbed by using a curvature of the first cable and the second cable during the collision.

(8) In the vehicle according to (6) or (7), the vehicle frame part is a cross member (support cross member 53A), and a lower end of the joint is located at a position lower than the first cable and the second cable.

According to (8), the first cable and the second cable are curved in the upper-lower direction toward the joint, so that the displacement due to a vehicle collision can be absorbed by using the curvature of the first cable and the second cable during the collision. Further, since the joint is located below the first cable and the second cable, the maintainability is good.

(9) In the vehicle according to any of (6) to (8), the first cable is disposed between the battery and the floor panel, and the second cable is disposed between the electric motor and the floor panel.

According to (9), the first cable and the second cable extending in the front-rear direction of the vehicle can be protected over a wide area.

(10) The vehicle according to (9) further includes:

a sub-frame (sub-frame 54) having a rectangular shape so as to surround the electric motor, and the joint is disposed between the battery and the sub-frame in the front-rear direction.

According to (10), since the joint is disposed between the battery and the sub-frame which are rigid bodies, the joint can be protected by the battery and the sub-frame.

(11) In the vehicle according to (10), the joint is disposed within a width of the battery in a height direction of the vehicle.

According to (11), the joint can be protected more reliably from a load input due to interference during a collision of the vehicle or the like.

(12) In the vehicle according to (10) or (11),
the joint is disposed within a width of the sub-frame in the height direction of the vehicle.

According to (12), the joint can be protected more reliably from a load input due to interference during a collision of the vehicle or the like.

(13) A vehicle (vehicle 1) includes:
a battery (battery 60) and an electric motor (motor MOT) which are disposed below a floor panel;
a first cable (first cable 821) which extends to one side (front side) in a front-rear direction of the vehicle and is connected to a battery side;
a second cable (second cable 822) which extends to the other side (rear side) in the front-rear direction and is connected to an electric motor side; and
a joint (joint 8) which includes a first connector portion (first connector portion 91) to which the first cable is connected and a second connector portion (second connector portion 92) to which the second cable is connected.

The joint is disposed between the battery and the electric motor in the front-rear direction of the vehicle.

According to (13), the first cable and the second cable extending in opposite sides in the front-rear direction of the vehicle are connected by the joint, so that two cables having better handling property than one long cable can be used. During a vehicle collision, an input load acting on the first cable and the second cable can be divided by the joint. Further, since the joint is disposed between the battery and the electric motor, the battery and the electric motor which are rigid bodies can protect the joint from an input of an external force during a vehicle collision.

The invention claimed is:

1. A joint disposed on a power transmission path between an electric motor configured to drive a vehicle and a battery, comprising:
   a first connector portion to which a first cable connected to a battery side is connected;
   a second connector portion to which a second cable connected to an electric motor side is connected;
   a joint box in which the first connector portion and the second connector portion are provided;
   a positive electrode bus bar which is provided inside the joint box and connects a positive electrode of the first connector portion and a positive electrode of the second connector portion; and
   a negative electrode bus bar which is provided inside the joint box and connects a negative electrode of the first connector portion and a negative electrode of the second connector portion,
   wherein the positive electrode bus bar and the negative electrode bus bar are disposed to be spaced from each other in an upper-lower direction.

2. The joint according to claim 1,
   wherein the first connector portion and the second connector portion are disposed adjacently on a surface of the joint box, and
   wherein the first and second cables and the positive and negative electrode bus bars are connected to the first connector portion and the second connector portion from opposite directions.

3. The joint according to claim 2,
   wherein the joint box includes:
   a box body which includes an opening on a surface opposite to the surface on which the first connector portion and the second connector portion are disposed;
   a joint cover which covers the opening;
   a sealing member which seals the box body and the joint cover;
   an inner cover which is disposed between the box body and the joint cover and surrounds the positive electrode bus bar and the negative electrode bus bar; and
   an inner sealing member which seals the inner cover and a holding wall which holds the first connector portion and the second connector portion.

4. The joint according to claim 3,
   wherein an opening is provided at a lower portion of the inner cover.

5. The joint according to claim 4,
   wherein an upper end of the opening is located at a position lower than an upper end of a bus bar which is one of the positive electrode bus bar and the negative electrode bus bar that is located on a lower side.

6. A vehicle, comprising:
   a battery and an electric motor which are disposed below a floor panel;
   a first cable which is connected to a battery side;
   a second cable which is connected to an electric motor side; and
   the joint according to claim 1,
   wherein the joint is fixed to a vehicle frame part,
   wherein the first cable extends from the joint to one side in a front-rear direction of the vehicle, and
   wherein the second cable extends from the joint to the other side in the front-rear direction.

7. The vehicle according to claim 6,
   wherein the joint is disposed outward than the first cable and the second cable in a width direction of the vehicle.

8. The vehicle according to claim 6,
   wherein the vehicle frame part is a cross member, and
   wherein a lower end of the joint is located at a position lower than the first cable and the second cable.

9. The vehicle according to claim 6,
   wherein the first cable is disposed between the battery and the floor panel, and
   wherein the second cable is disposed between the electric motor and the floor panel.

10. The vehicle according to claim 9 further comprising:
    a sub-frame having a rectangular shape so as to surround the electric motor,
    wherein the joint is disposed between the battery and the sub-frame in the front-rear direction.

11. The vehicle according to claim 10,
    wherein the joint is disposed within a width of the battery in a height direction of the vehicle.

12. The vehicle according to claim 10,
    wherein the joint is disposed within a width of the sub-frame in the height direction of the vehicle.

13. A vehicle, comprising:
    a battery and an electric motor which are disposed below a floor panel;
    a first cable which extends to one side in a front-rear direction of the vehicle and is connected to a battery side;
    a second cable which extends to the other side in the front-rear direction and is connected to an electric motor side; and a joint which includes a first connector portion to which the first cable is connected and a second connector portion to which the second cable is connected,
wherein the joint is disposed between the battery and the electric motor in the front-rear direction of the vehicle.

* * * * *